(12) United States Patent
Ni et al.

(10) Patent No.: US 11,371,141 B2
(45) Date of Patent: Jun. 28, 2022

(54) PLASMA PROCESS APPARATUS WITH LOW PARTICLE CONTAMINATION AND METHOD OF OPERATING THE SAME

(71) Applicant: Advanced Micro Fabrication Equipment Inc. China, Shanghai (CN)

(72) Inventors: Tuqiang Ni, Shanghai (CN); Rason Zuo, Shanghai (CN); Shenjian Liu, Shanghai (CN); Xingjian Chen, Shanghai (CN); Lei Wan, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/226,617

(22) Filed: Dec. 19, 2018

(65) Prior Publication Data
US 2019/0194802 A1   Jun. 27, 2019

(30) Foreign Application Priority Data
Dec. 25, 2017 (CN) .......................... 201711420583.3

(51) Int. Cl.
C23C 16/44 (2006.01)
H01J 37/32 (2006.01)
C23C 16/52 (2006.01)

(52) U.S. Cl.
CPC ...... *C23C 16/4412* (2013.01); *C23C 16/4404* (2013.01); *C23C 16/4408* (2013.01);
(Continued)

(58) Field of Classification Search
CPC ................................................ C23C 16/4412
See application file for complete search history.

(56) References Cited

U.S. PATENT DOCUMENTS 4,955,808 A * 9/1990 Miyagawa ............. C30B 33/00
432/5
2001/0054381 A1* 12/2001 Umotoy .............. C23C 16/4412
118/715
(Continued)

FOREIGN PATENT DOCUMENTS

JP        2004-288982    * 10/2004  ............. C23C 16/44

OTHER PUBLICATIONS

English Translation, JP 2004-288982, Shigeoka, Oct. 2004 (Year: 2004).*

*Primary Examiner* — Keath T Chen
(74) *Attorney, Agent, or Firm* — Womble Bond Dickinson (US) LLP

(57) ABSTRACT

Embodiments of the present disclosure disclose a plasma process apparatus with low particle contamination and a method of operating the same, wherein the plasma process apparatus comprises a chamber body and a liner, wherein a dielectric window is provided above the liner; the chamber body, the liner, and the dielectric window enclose a reaction space; a base for placing a wafer is provided at a bottom portion inside the reaction space; a vacuum pump device for pumping a gas out of the reaction space and maintaining a low pressure therein is provided below the base; a shutter for shuttering between an opening on a chamber body sidewall and an opening on a liner sidewall is provided inside the chamber body, for blocking contamination particles in the gas from flowing from a transfer module to the reaction space; a groove is provided at a lower portion of the liner, wherein a flowing space enclosed by a liner outer wall below the shutter and a chamber body inner wall is in communication with an inner space of the liner via the groove to form a gas flow path, such that the contamination particles entering the flowing space are pumped away by the vacuum pump device via the gas flow path. The present disclosure may not (Continued)

only keep the current wafer free from being contaminated, but also may reduce contamination for a next wafer transfer; besides, it enables introduction of clean air to make the contamination particles carried out of the reaction space with a more significant effect and a higher efficiency.

11 Claims, 3 Drawing Sheets

(52) U.S. Cl.
CPC .......... *C23C 16/4409* (2013.01); *C23C 16/52* (2013.01); *H01J 37/321* (2013.01); *H01J 37/32477* (2013.01); *H01J 37/32513* (2013.01); *H01J 2237/022* (2013.01)

(56) References Cited

U.S. PATENT DOCUMENTS

| | | | | |
|---|---|---|---|---|
| 2003/0198754 | A1* | 10/2003 | Xi | C23C 16/45544 427/576 |
| 2004/0187452 | A1* | 9/2004 | Edo | B01D 53/265 55/385.2 |
| 2013/0115776 | A1* | 5/2013 | Abatchev | H01J 37/32816 438/703 |

* cited by examiner

PLASMA PROCESS APPARATUS WITH LOW PARTICLE CONTAMINATION AND METHOD OF OPERATING THE SAME

RELATED APPLICATION

The present application claims priority to and the benefit of Chinese Patent Application No. 201711420583.3, filed on Dec. 25, 2017, and the disclosure of which is hereby incorporated herein by reference in its entirety.

FIELD

Embodiments of the present disclosure relate to the field of corrosion-resistance protection technologies for etching devices, and more particularly relate to a plasma process apparatus with low particle contamination and a method of operating the same.

BACKGROUND

In the prior art, during wafer transfer between a transfer module (TM) and a plasma process module 1 (PM), gas pressure imbalance between these chambers causes gas flow therein, such that particles floating or sticking in respective chambers will move along with the gas flow towards each other chamber, thereby causing particle contamination in the chambers.

FIG. 1 shows a simplified schematic diagram of an etching (ETCH) system, comprising a transfer module 2, a slit valve 3, and a plasma process module 1. Particularly, the plasma process module 1 comprises an insulation window 11, a liner 12, a chamber body 13, a pendulum valve 14, and a turbo pump 15.

When the transfer module 2 transfers a wafer into the plasma process module 1, gas flow occurs due to imbalance pressures between the chambers of the two modules. Supposing that the gas flows from the transfer module 2 towards the plasma process module 1, the floating particles within the chamber body of the transfer module 2 also flows along with the gas to the plasma process module 1, causing particle contamination. In order to reduce particle contamination, this event may be decreased by controlling a time sequence of opening and closing the slit door shutter 16.

For example, when the slit valve 3 is opened, the slit door shutter 16 is opened thereafter, letting the gas with particles in the chamber of the transfer module 2 directly rush to the slit door shutter 16, limiting the gas with the particles from directly rushing to an electrostatic chuck (ESC) and a wafer (not shown). This process is effective for protecting the current wafer, but makes potential risk to the next wafer, because the particles rushing with the gas from the transfer module 2 towards the slit door shutter 16 will be blocked by the slit door shutter 16 and then fall into a dead zone. The dead zone formed between the outer surface of liner 12, the inner surface of chamber body 13, and under the slit door shutter 16, in the dead zone the particles can hardly be promptly pumped away by the turbo pump 15.

Consequently, at the time of transferring a next wafer, the gas in the transfer module 2 flows again to the plasma process module 1, and the rushing gas flow will disturb the particles falling off into the dead zone during the last wafer transfer procedure, and spread the disturbed particles to the ESC and the wafer, contaminates the wafer at last. Particularly, the dead zone formed between the liner 12, the slit door shutter 16, and the chamber body 13 has no path enabling an effective gas flow, such that the particles falling into the dead zone would finally contaminate the subsequently transferred wafer.

SUMMARY

An objective of the present disclosure is to provide a plasma process apparatus with low particle contamination and a method of operating the same, which not only guarantees protection of the current wafer but also may reduce contamination of a subsequent wafer transfer by means of providing a groove at a lower portion of a liner, supplying a clean gas from an upper portion of a chamber body, blocking, by a shutter provided in the chamber body, contamination particles in the gas flowing from a transfer module towards a reaction space, communicating, by a flowing space enclosed by a liner outer wall below the shutter and a chamber body inner wall, with an inner space of the liner via the groove to form a gas flow path, such that the contamination particles are pumped away by a vacuum pump device through the gas flow path.

To achieve the objective above, a plasma process apparatus with low particle contamination according to the present disclosure comprises a chamber body and a liner, a dielectric window is provided above the liner; the chamber body, the liner, and the dielectric window enclose a reaction space; a base for placing a wafer is provided at a bottom portion inside the reaction space; a vacuum pump device for pumping a gas out of the reaction space and maintaining a low pressure therein is provided below the base;

a shutter for shielding between an opening on a chamber body sidewall and an opening on a liner sidewall is provided inside the chamber body, for blocking contamination particles in the gas flow from a transfer module to the reaction space;

a groove is provided at a lower portion of the liner, wherein a flowing space enclosed by the outer wall of the liner and the inner wall of the chamber body, the flowing space is positioned below the shutter and communicates with an inner space of the liner via the groove to form a gas flow path, such that the contamination particles entering the flowing space are pumped away by the vacuum pump device via the gas flow path.

Preferably, the plasma process apparatus is connected with the transfer module via a slit valve; when the slit valve is opened and the gas in the transfer module flows towards the reaction space, the shutter is closed, and the contamination particles in the gas in the transfer module directly collide against the shutter and then fall into the flowing space.

Preferably, the vacuum pump device is a turbo pump, the turbo pump device being connected with the chamber body via a pendulum valve.

Preferably, a clean gas is supplied from an upper portion of the chamber body, and the clean gas flows vertically and downwardly along the shutter to form a gas curtain, and the clean gas flows through the shutter and the flowing space, at least exhausted from the reaction space via the gas flowing path.

Preferably, a gas channel is provided on the chamber body to communicate with a clean gas source that supplies the clean gas, and the clean gas enters the chamber body and then flows downwardly along a slit between the inner wall of chamber body and the outer wall of liner.

Preferably, an up-down movable lifting rod is provided below the shutter such that the shutter may move between two positions of different heights; wherein when the lifting rod is at a first height, the shutter is in a closed state, and the shutter shields the liner sidewall opening; and when the support lifting is at a second height, the shutter is in an open state, and a wafer from the transfer module passes through the liner sidewall opening and disposed onto the base in the reaction space.

Preferably, a bottom end of the liner includes an annular transverse extension portion extending from the inner side and towards the base, a plurality of gas passages being provided on the annular transverse extension part, such that when the reaction gas inside the reaction space flows through the annular transverse extension portion, the plasma in the reaction gas is quenched.

The present disclosure further provides a plasma etching system, comprising a transfer module and a plasma process apparatus with low particle contamination as mentioned above; a groove is provided at lower portion of the liner of the plasma process apparatus; a shutter is provided in the chamber body of the plasma process apparatus, for blocking the contamination particles in the gas flowing from the transfer module towards the reaction space; a flowing space positioned below the shutter and enclosed by the outer wall of the liner and the inner wall of chamber body is in communication with an inner space of the liner via the groove to form a gas flowing path, such that the contamination particles are pumped away by the vacuum pump device via the gas flowing path.

Preferably, the vacuum pump device is a turbo pump, the turbo pump device being connected with the chamber body via a pendulum valve.

Preferably, the plasma process apparatus is connected with the transfer module via a slit valve; when the slit valve is opened, the gas in the transfer module flows towards the reaction space; and the shutter is closed, the contamination particles in the gas from the transfer module directly collide against the shutter and then downwardly enter the flowing space.

The present disclosure further provides an operating method of the plasma process apparatus as mentioned above, comprising:

first opening the slit valve, and closing a shutter inside a chamber body;

when the gas in a transfer module flows towards a reaction space of the plasma process apparatus, contamination particles in the gas flowing from a transfer module blocked by the shutter; and pumping away the contamination particles by a vacuum pump device, wherein the contamination particles flow through the flowing space below the shutter, the low space enclosed by the outer wall of liner and the inner wall of the chamber body, and a groove disposed at lower portion of the liner; wherein the flowing space is in communication with an inner space of the liner via the groove to thereby form a gas flowing path.

Preferably, after the contamination particles are carried away from the reaction space via the gas flowing path, the shutter is opened such that a wafer is transferred into/out of the reaction space.

Compared with the prior art, the present disclosure has the following advantages: the present disclosure achieves the objective of removing a dead zone by means of providing a groove at a lower portion of a liner, supplying a clean gas from an upper portion of a chamber body, blocking, by a shutter provided in the chamber body, contamination particles in the gas flowing from a transfer module towards a reaction space, communicating, by a flowing space enclosed by a liner outer wall below the shutter and a chamber body inner wall, with an inner space of the liner via the groove to form a gas flow path, such that the contamination particles are pumped away by a vacuum pump device through the gas flow path, which not only guarantees protection of the current wafer but also may reduce contamination for the subsequent wafer transfer. Meanwhile, by supplying a clean gas to form a gas curtain, the contamination particles are carried out of the reaction space with a more significant effect and a higher efficiency.

DETAILED DESCRIPTION OF EMBODIMENTS

The present disclosure discloses a plasma process apparatus and method with low contamination particles. To make the present disclosure more apparent and easily comprehensible, the present disclosure will be further illustrated with reference to the accompanying drawings and the preferred embodiments.

Figure 1:
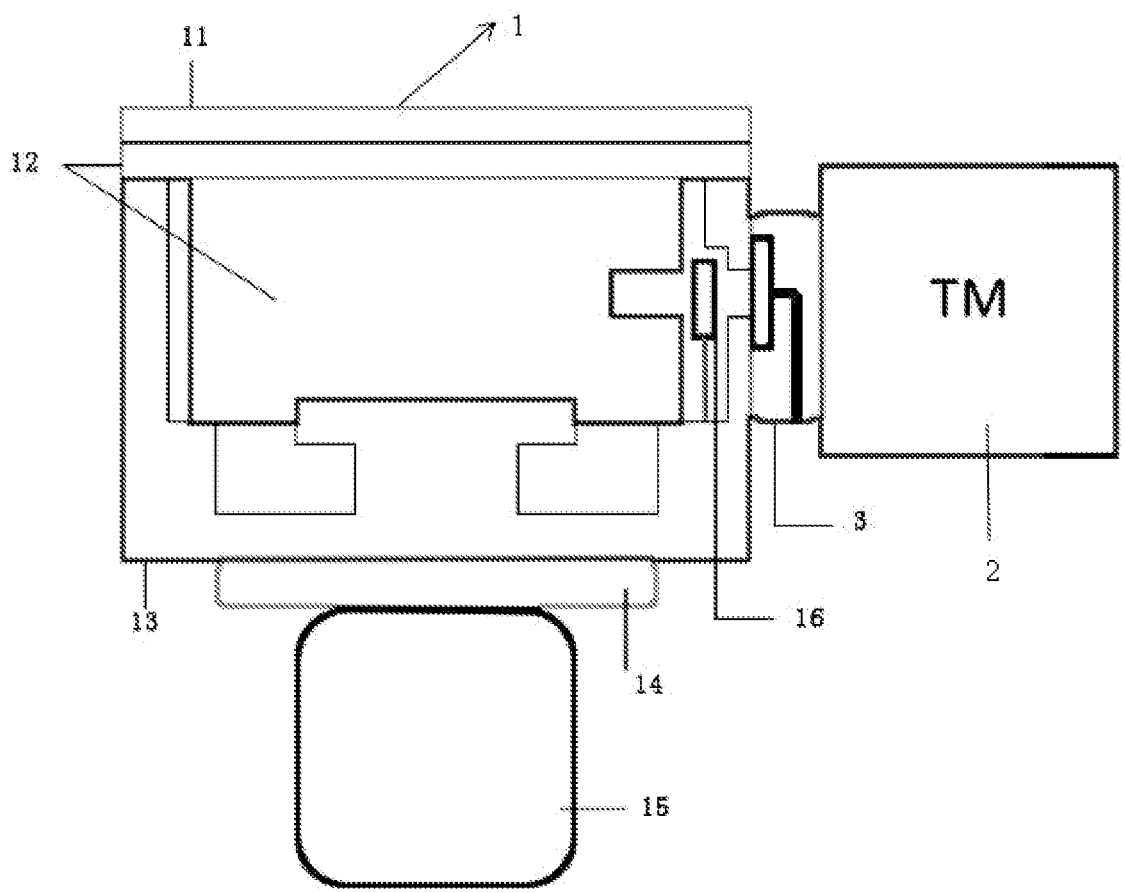
FIG. 1 is a simplified schematic diagram of an ETCH system in the prior art.
Figure 2:
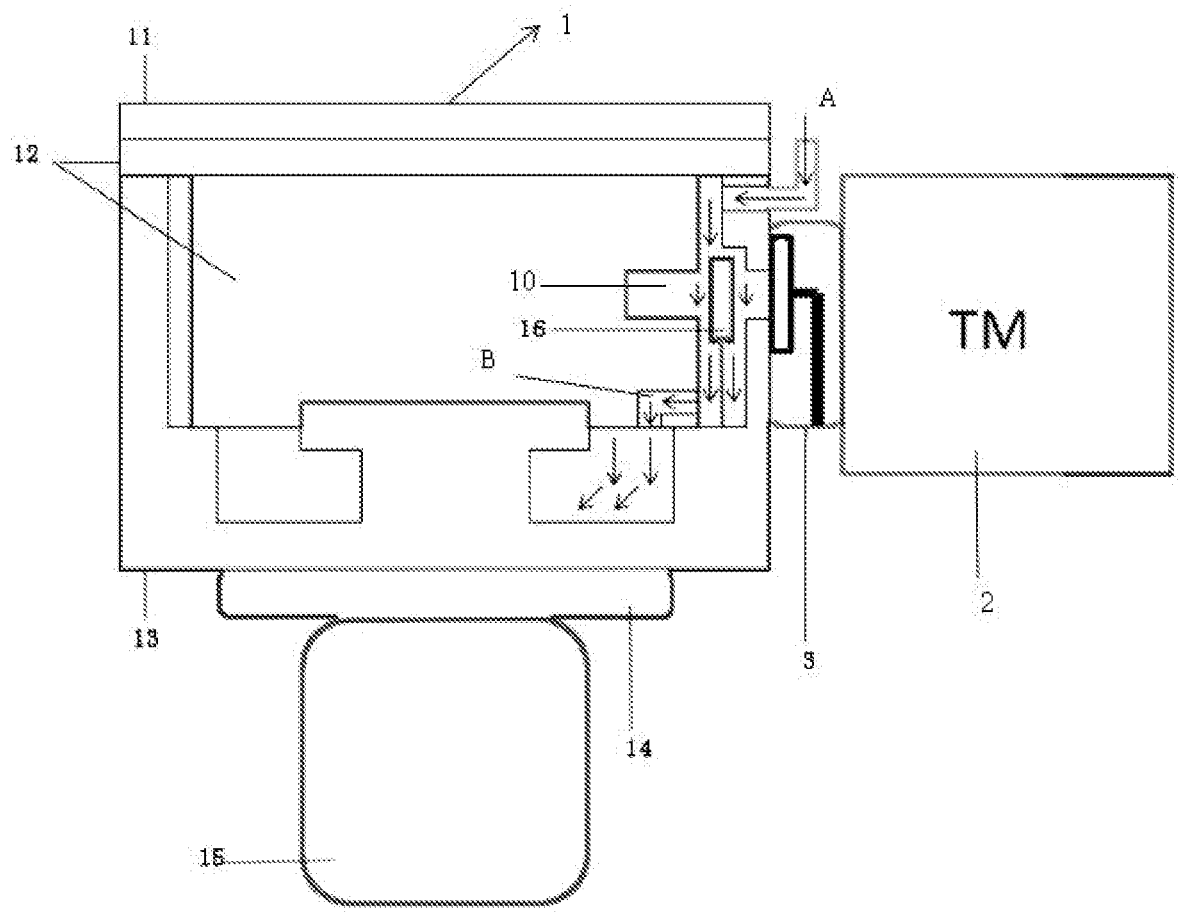
FIG. 2 is a schematic diagram of an ETCH system according to Embodiment 1 of the present disclosure.

As shown in FIG. 2, a plasma etching system according to the present disclosure comprises: a plasma process apparatus 1, a transfer module 2, and a slit valve 3. The slit valve 3 is disposed between the transfer module 2 and the plasma process apparatus 1, the slit valve 3 being connected to the transfer module 2 and the plasma process apparatus 1, respectively.

The plasma process apparatus 1 comprises a chamber body 13, a liner 12, a pendulum valve 14, a shutter 16, and a turbo pump 15. Specifically, a dielectric window 11 is disposed above the liner 12, for arranging an induction coil connected to a radio frequency power source. The chamber body 13, the liner 12, and the dielectric window 11 enclose a reaction space. A bottom portion inside the reaction space includes a base for placing a wafer, and below the base is provided a vacuum pump device for pumping out a gas inside the reaction space and maintaining a low pressure therein. The pump vacuum device may be a turbo pump 15, which turbo pump 15 may be connected to the chamber body 13 via the pendulum valve 14.

A bottom end of the liner 12 includes an annular transverse extension portion extending towards the base at an inner side, a plurality of gas passages being provided on the annular transverse extension part, such that reaction gas including plasma inside the reaction space will flow through the annular transverse extension portion, and the plasma is quenched.

As shown in FIG. 2, a shutter 16 is provided inside the chamber body 13; the shutter 16 shields between an opening on a chamber body 13 sidewall and an opening 10 on a liner sidewall, for blocking contamination particles in the gas flowing from a transfer module 2 to the reaction space.

An up-down movable lifting rod is disposed below the shutter 16, such that the shutter 16 may move between two positions of different heights (including a first height and a second height), thereby make the shutter switches between open and closed state. Specifically, the lifting rod may also be disposed above the shutter 16 and connected with a top portion of the liner, which may also achieves up-down movement of the shutter without affecting the gas flow path.

When the lifting rod moves upward to the first height, the shutter 16 blocks the liner sidewall opening 10; at this position, the shutter 16 is in a closed state. When the lifting rod moves downward to the second height, the wafer from the transfer module 2 will be transferred onto the base placed inside the reaction space via the liner sidewall opening 10; at this position, the shutter 16 is in an opened state. Specifically, the first height is greater than the second height.

When transferring a first wafer, the slit valve 3 is opened first; at this point, the shutter 16 is closed, and then the gas inside the chamber body of the transfer module 2 flows towards an opening of the chamber body 13; after the contamination particles in the gas directly collide against the shutter 16, they downwardly enter a space below the shutter, the space enclosed by the liner outer wall and the chamber body inner wall, thereby preventing the gas with the particles from directly rushing towards the electrostatic chuck and the wafer inside the reaction space, and avoiding contaminating the wafer.

Particularly, the contamination particles blocked by the shutter 16 during the first wafer transfer procedure will fall into a space enclosed by the liner outer wall below the shutter 16 and the chamber body 13; because the contamination particles are not easily promptly pumped away by the turbo pump 15, the space here is now a dead zone.

Specifically, at an interval after the first wafer transfer step and before the second wafer transfer step, the slit valve 3 and the shutter 16 are both in a closed state.

Embodiment 1

As shown in FIG. 2, in Embodiment 1, a groove B is provided at a lower portion of the liner 12; a flowing space enclosed by the liner outer wall below the shutter 16 and the chamber body inner wall is in communication with the inner space of the liner 12 via the groove B, thereby forming an effective gas flow path.

A chamber body 13 is provided with a gas channel in communication with a clean gas source that supplies a clean gas A; at the interval after first wafer transfer step and before the second wafer transfer step, the clean gas A (e.g., Argon (Ar), and the like) enters the chamber body 13, then flows downwardly and vertically along the shutter 16 to form a gas curtain, i.e., flowing from top to bottom along a gap between the chamber body inner wall and the liner outer wall, and then passes through a flowing space enclosed by the liner outer wall below the shutter 16 and the chamber body, then through the groove B, such that the contamination particles are pumped away by the turbo pump 15, such that the contamination particles falling off in the last wafer transfer procedure are carried out of the reaction space, thereby eliminating the original dead zone and achieving the objective of contamination control, i.e., reducing wafer contamination from gas disturbing the particles accumulated in the dead zone during the next wafer transfer step.

After the contamination particles are carried away from the reaction space via the gas flowing path, the shutter 16 is opened such that the next wafer is transferred into/out of the reaction space.

Embodiment II

Figure 3:
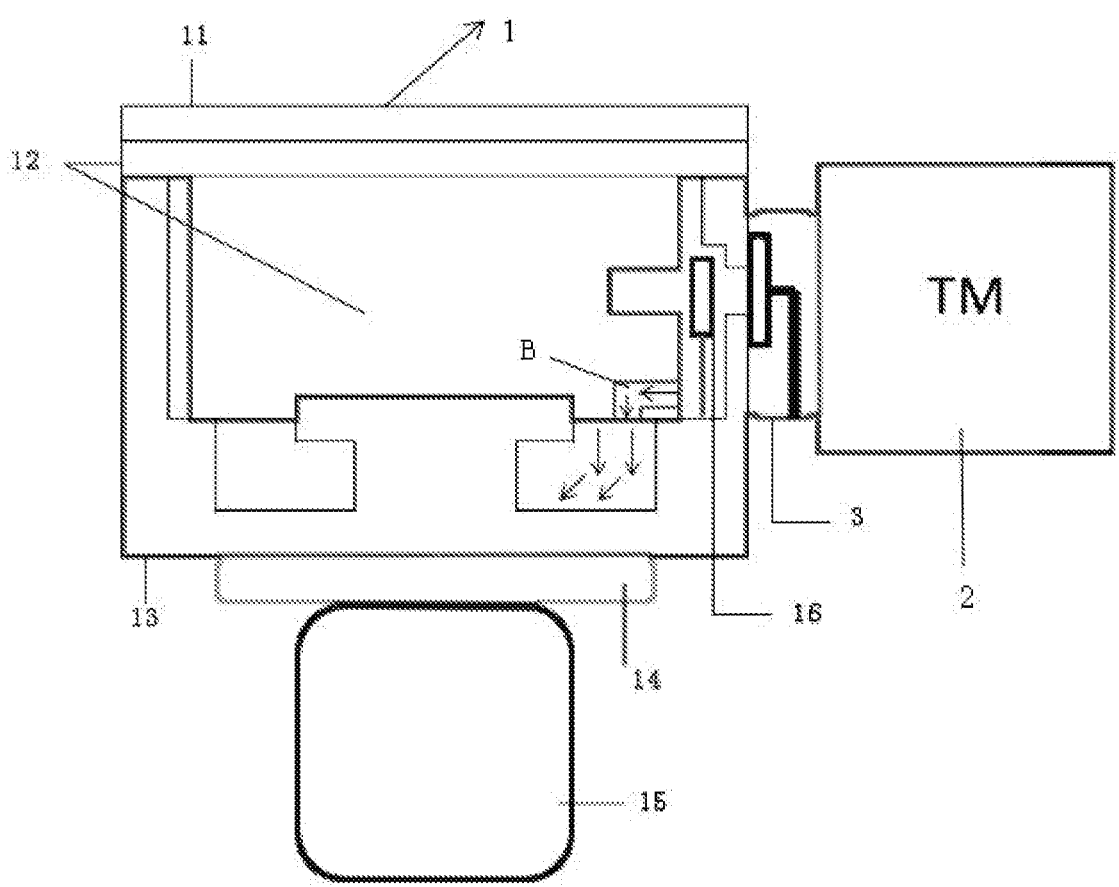
FIG. 3 is a schematic diagram of an ETCH system according to Embodiment 2 of the present disclosure.

As shown in FIG. 3, in Embodiment 1, a groove B is provided at a lower portion of the liner 12; a flowing space enclosed by the liner outer wall below the shutter 16 and the chamber body inner wall is in communication with an inner space of the liner 12 via the groove B, thereby forming an effective gas flow path.

In Embodiment II, the chamber body 13 is not provided with a gas channel in communication with a clean gas source that supplies the clean gas, i.e., no clean gas is supplied from an upper portion of the chamber body 13, where only the gas flowing path is in communication with the turbo pump 15.

At an interval after the first wafer transfer step and before the second wafer transfer step, when the turbo pump 15 is opened, the contamination particles falling into the space enclosed by the liner outer wall below the shutter 16 and the chamber body 13 during the last wafer transfer procedure is subject to a traction force of the turbo pump 15; at this point, the space enclosed by the liner outer wall below the shutter 16 and the chamber body inner wall forms a flowing space, and the contamination particles, under the action of the traction force, pass through the flowing space and are then pumped away by the turbo pump 15 via the groove B, thereby forming a complete and effective gas flowing path to carry the contamination particles away from the reaction space, which then eliminates the original dead zone and achieves the objective of contamination control; in other words, contamination of the wafer due to the gas-disturbed particles falling into the dead zone upon next wafer transfer is reduced.

After the contamination particles are carried away from the reaction space via the gas flowing path, the shutter 16 is opened such that the wafer is transferred into/out of the reaction space.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

The invention claimed is:

1. A plasma process apparatus (1) with low particle contamination, comprising: a chamber body (13) and a liner (12), a dielectric window (11) is provided above the liner (12); the chamber body (13), the liner (12), and the dielectric window (11) enclose a reaction space to maintain plasma with a reaction gas; a base for placing a wafer is provided at a bottom portion inside the reaction space; a vacuum pump device provided below the base for maintaining a low pressure within the reaction space;

a shutter (16) for shielding between an opening on the chamber body (13) sidewall and an opening (10) on a liner sidewall is provided inside the chamber body (13), for blocking contamination particles in the gas flow from a transfer module (2) to the reaction space;

a groove (B) is provided at a lower portion of the liner (12), wherein a flowing space is enclosed by the outer wall of the liner and the inner wall of the chamber body, the flowing space is in communication with an inner space of the liner via the groove to form a flow path and is positioned below the shutter and communicates with a pumping space below the base via the groove (B) to form the flow path, such that the contamination particles entering the flowing space collide with the shutter and are downwardly enter the flowing space below the shutter and are pumped away by the vacuum pump device via the gas flow path;

a gas channel in communication with a clean gas source that supplies a clean gas from an upper portion of the chamber body, wherein the clean gas flows vertically and downwardly along a surface of the shutter facing the opening on the chamber body sidewall and liner body sidewall to thereby form a clean gas curtain.

2. The plasma process apparatus (1) according to claim 1, wherein:
the plasma process apparatus (1) is connected with the transfer module (2) via a slit valve (3);
when the slit valve (3) is opened and the gas in the transfer module (2) flows towards the reaction space, the shutter (16) is closed, and the contamination particles in the gas in the transfer module (2) directly collide against the shutter (16) and then fall into the flowing space.

3. The plasma process apparatus (1) according to claim 1, wherein:
the vacuum pump device is a turbo pump (15), the turbo pump device (15) being connected with the chamber body (13) via a pendulum valve (14).

4. The plasma process apparatus (1) according to claim 1, wherein:
the clean gas is exhausted from the reaction space via the gas flow path.

5. The plasma process apparatus (1) according to claim 1, wherein:
an up-down movable lifting rod is provided below the shutter (16) such that the shutter (16) may move between two positions of different heights;
wherein when the lifting rod is at a first height, the shutter (16) is in a closed state, and the shutter (16) shields the liner sidewall opening (10); and
when the lifting rod is at a second height, the shutter (16) is in an open state, and a wafer from the transfer module (2) passes through the liner sidewall opening (10) and disposed onto the base in the reaction space.

6. The plasma process apparatus (1) according to claim 1, wherein:
a bottom end of the liner (12) includes an annular transverse extension portion extending from the inner side and towards the base, a plurality of gas passages being provided on the annular transverse extension part, such that when the reaction gas inside the reaction space flows through the annular transverse extension portion, the plasma in the reaction gas is quenched.

7. A plasma etching system, comprising a transfer module (2) and a plasma process apparatus (1) with low particle contamination; the plasma processing apparatus comprising a chamber body (13) and a liner (12), a dielectric window (11) is provided above the liner (12); the chamber body (13), the liner (12), and the dielectric window (11) enclose a reaction space; a base for placing a wafer is provided at a bottom portion inside the reaction space; a vacuum pump device provided below the base for pumping a gas out of the reaction space and maintaining a low pressure therein; wherein a groove (B) is provided at lower portion of the liner (12) of the plasma process apparatus (1); a shutter (16) is provided in the chamber body (13) of the plasma process apparatus (1), for blocking contamination particles in the gas flowing from the transfer module (2) towards the reaction space; a flowing space positioned below the shutter (16) and enclosed by the outer wall of the liner and the inner wall of chamber body is in communication with an inner space of the liner (12) via the groove (B) to form a gas flow path, such that the contamination particles are pumped away by the vacuum pump device via the gas flow path; and a gas channel is in communication with a clean gas source that supplies a clean gas from an upper portion of the chamber body, wherein the clean gas flows vertically and downwardly along a surface of the shutter facing the opening on the chamber body sidewall and liner body sidewall to thereby form a gas curtain.

8. The plasma etching system according to claim 7, wherein:
the vacuum pump device is a turbo pump (15), the turbo pump device (15) being connected with the chamber body (13) via a pendulum valve (14).

9. The plasma etching system according to claim 7, wherein:
the plasma process apparatus (1) is connected with the transfer module (2) via a slit valve (3);
when the slit valve (3) is opened, the gas in the transfer module (2) flows towards the reaction space; and
the shutter (16) is closed, the contamination particles in the gas from the transfer module (2) directly collide against the shutter (16) and then downwardly enter the flowing space.

10. An operating method of the plasma process apparatus (1) according to claim 1, comprising:
first opening a slit valve (3), and closing a shutter (16) inside a chamber body (13);
when the gas in a transfer module (2) flows towards a reaction space of the plasma process apparatus (1), contamination particles in the gas flowing from a transfer module (2) blocked by the shutter (16); and
pumping away the contamination particles by a vacuum pump device, wherein the contamination particles flow through the flowing space below the shutter, the flow space enclosed by the outer wall of liner and the inner wall of chamber body, and a groove (B) disposed at lower portion of the liner (12); wherein the flowing space is in communication with an inner space of the liner (12) via the groove (B) to thereby form a gas flowing path.

11. The operating method of the plasma process apparatus (1) according to claim 10, wherein:
after the contamination particles are carried away from the reaction space via the gas flowing path, the shutter (16) is opened such that a wafer is transferred into/out of the reaction space.

* * * * *